(12) United States Patent
Kawagishi et al.

(10) Patent No.: US 7,042,297 B2
(45) Date of Patent: May 9, 2006

(54) HIGH-FREQUENCY OSCILLATOR

(75) Inventors: Makoto Kawagishi, Shiga-ken (JP); Hidemori Akagi, Ishikawa-ken (JP); Tomoe Izumi, Komatsu (JP); Masanari Tago, Ishikawa-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/853,676

(22) Filed: May 26, 2004

(65) Prior Publication Data

US 2005/0017814 A1    Jan. 27, 2005

(30) Foreign Application Priority Data

Jul. 24, 2003  (JP) ............................. 2003-201345
Feb. 27, 2004  (JP) ............................. 2004-053097

(51) Int. Cl.
*H03B 5/12* (2006.01)

(52) U.S. Cl. .......................... 331/49; 331/46
(58) Field of Classification Search ............... 331/49, 331/46, 179, 2

See application file for complete search history.

(56) References Cited

U.S. PATENT DOCUMENTS 6,411,168 B1 * 6/2002 Yoshida ..................... 331/49
2002/0125958 A1 * 9/2002 Ikarashi ..................... 331/2

FOREIGN PATENT DOCUMENTS

JP    2001-237640    8/2001

* cited by examiner

*Primary Examiner*—Joseph Chang
(74) *Attorney, Agent, or Firm*—Keating & Bennett, LLP

(57) ABSTRACT

A frequency-selective high-frequency oscillator includes a first switching circuit that controls the operation of a first amplifying circuit, and a second switching circuit that controls the operation of the first switching circuit and a second amplifying circuit. Switching control signals are input to the second switching circuit. When the switching control signal is "Low", the second switching circuit turns ON and the second amplifying circuit only operates, thereby outputting a high frequency signal with a resonant frequency according to a second resonant circuit. On the other hand, when the switching control signal is "High", the second switching circuit turns OFF and the first switching circuit turns ON, which causes the first amplifying circuit only to operate. Thus, a high frequency signal with a resonant frequency acceding to a first resonant circuit is output.

16 Claims, 12 Drawing Sheets

HIGH-FREQUENCY OSCILLATOR

BACKGROUND OF THE INVENTION

1. Field of the Invention

The present invention relates to high-frequency oscillators provided in various high-frequency apparatuses, and more particularly, the present invention relates to a frequency-selective high-frequency oscillator that switches operation between two different oscillation frequencies.

2. Description of the Related Art

Some known high-frequency oscillators, such as voltage controlled oscillators, function as frequency-selective high-frequency oscillators that oscillate high-frequency signals with two different frequencies as a single unit (circuit). These frequency-selective high-frequency oscillators each include first and second resonant circuits that oscillate at different frequencies from each other; first and second amplifying circuits that are connected to the first and second resonant circuits, respectively; a buffer circuit that amplifies and outputs an output signal from the first or second amplifying circuit; and a selection circuit that selects the first or second amplifying circuit. This selection circuit includes first and second switching circuits that are connected to the first and second amplifying circuits, respectively. Furthermore, first and second control signal input terminals for independently operating the respective first and second switching circuits are also provided. In such a frequency-selective high-frequency oscillator with the above-described structure, a control signal is input to either of the first and second switching circuits by selecting the first or second control signal input terminal according to the desired frequency to be output. The amplifying circuit to be operated is thus selected to oscillate and output a signal with the desired frequency (for example, refer to Japanese Unexamined Patent Application Publication No. 2001-237640).

Another example of these frequency-selective high-frequency oscillators is shown in FIG. 12.

FIG. 12 is a circuit diagram of another related frequency-selective high-frequency oscillator, which the applicants of the present application are unable to confirm whether it has been publicly disclosed or used so as to constitute prior art. In the following description, the structure of the frequency-selective high-frequency oscillator is outlined by describing the flow of a high-frequency signal. A description of the passive elements is not provided.

Referring to FIG. 12, a first resonant circuit 101a with a first resonant frequency $f_1$ is connected to the base terminal of an NPN transistor $Tr_{102}$ of a first amplifying circuit 103a, and a second resonant circuit 101b with a second resonant frequency $f_2$ is connected to the base terminal of an NPN transistor $Tr_{103}$ of a second amplifying circuit 103b. The first amplifying circuit 103a oscillates at the resonant frequency f, based on the first resonant circuit 101a, that is, in conjunction with the first resonant circuit 101a, and outputs part of the high-frequency signal. Similarly, the second amplifying circuit 103b oscillates at the resonant frequency $f_2$ based on the second resonant circuit 101b, that is, in conjunction with the second resonant circuit 101b, and outputs part of the high-frequency signal. A buffer circuit 104 including an NPN transistor $Tr_{101}$ is connected to the first amplifying circuit 103a including the transistor $Tr_{102}$ and to the second amplifying circuit 103b including the transistor $Tr_{103}$. The buffer circuit 104 receives a high-frequency signal output from either of these amplifying circuits, and then amplifies and outputs the high-frequency signal to an output terminal 106.

Furthermore, this high-frequency oscillator includes a first switching circuit (SW1) 102a including a PNP transistor $Tr_{104}$ having the collector terminal connected to the base terminal of the transistor $Tr_{102}$ of the first amplifying circuit 103a and having the emitter terminal connected to a power terminal 105; and a second switching circuit (SW2) 102b including an NPN transistor $Tr_{105}$ having the collector terminal connected to the emitter terminal of the transistor $Tr_{103}$ of the second amplifying circuit 103b and having the emitter terminal grounded. The base terminals of the transistors $Tr_{104}$ and $Tr_{105}$ of these switching circuits 102a and 102b are connected to a terminal 107 for inputting a switching control signal.

With the structure described above, when the switching control signal is "Low", the first switching circuit 102a turns ON and the second switching circuit 102b turns OFF, and hence only the first amplifying circuit 103a operates. As a result, a high-frequency signal with the first resonant frequency $f_1$ is oscillated and output. In contrast, when the switching control signal is "High", the first switching circuit 102a turns OFF and the second switching circuit 102b turns ON, and hence only the second amplifying circuit 103b operates. As a result, a high-frequency signal with the second resonant frequency $f_2$ is oscillated and output.

In the frequency-selective high-frequency oscillator disclosed in the Japanese Unexamined Patent Application Publication No. 2001-237640, however, control is complicated because two different control signals are necessary to select a frequency.

In contrast, in the frequency-selective high-frequency oscillator shown in FIG. 12, only one control signal is sufficient. However, this causes another problem as described below.

In the high-frequency oscillator shown in FIG. 12, when the switching control signal becomes "High", the second switching circuit 102b turns ON. In this case, if noise is input from the switching control signal input terminal 107 along with the switching control signal, the noise is input to the transistor $Tr_{103}$ of the second amplifying circuit 103b via the second switching circuit 102b and is superposed on the oscillated signal. In this manner, the high frequency signal having noise superposed thereon is input to the transistor $Tr_{101}$ of the buffer circuit 104 and amplified, and therefore noise is also amplified. This causes the S/N ratio of the output high-frequency signal to decrease.

SUMMARY OF THE INVENTION

In order to overcome the problems described above, preferred embodiments of the present invention provide a frequency-selective high-frequency oscillator that outputs a stable high-frequency signal regardless of which of two different frequencies is selected.

According to a preferred embodiment of the present invention, a high frequency oscillator includes a first resonant circuit and a second resonant circuit which oscillate at different resonant frequencies from each other, a first amplifying circuit including an NPN transistor, a second amplifying circuit including an NPN transistor, a buffer circuit which amplifies a signal input from the first amplifying circuit or the second amplifying circuit, and a selection circuit which switches operation between the first amplifying circuit and the second amplifying circuit. In this high frequency oscillator, the first amplifying circuit is connected to the first resonant circuit and the second amplifying circuit is connected to the second resonant circuit. The selection circuit includes a first switching circuit, a second switching circuit, and a switching control signal input terminal for inputting a control signal. The first switching circuit includes a PNP transistor having a collector terminal connected to a base terminal of the NPN transistor of the first amplifying circuit and an emitter terminal connected to a power supply. The second switching circuit includes a PNP transistor having a collector terminal connected to a base terminal of the NPN transistor of the second amplifying circuit and an emitter terminal connected to the power supply. The base terminal of the PNP transistor of the second switching circuit is connected to the switching control signal input terminal and the collector terminal of the PNP transistor of the second switching circuit is connected to the base terminal of the PNP transistor of the first switching circuit.

With the structure described above, when a "Low" switching control signal is input from the switching control signal input terminal, the PNP transistor of the second switching circuit turns ON. As a result, a base bias current is supplied to the NPN transistor of the second amplifying circuit, which is thus operated. Consequently, the second amplifying circuit oscillates a high-frequency signal with a resonant frequency based on the second resonant circuit, that is, in conjunction with the second resonant circuit, and outputs part of the high-frequency signal to the buffer circuit. The buffer circuit amplifies the high-frequency signal that has been input and outputs it to the output terminal. In this case, as a result of the second switching circuit operating, the base terminal of the PNP transistor of the first switching circuit becomes "High", and therefore the first switching circuit does not operate.

Here, when the second switching circuit and the second amplifying circuit operate, the switching control signal is "Low". Thus, the switching control signal is free from noise and no noise is superposed on a current that flows from the second switching circuit to the second amplifying circuit. Consequently, a high-frequency signal free from noise is input and amplified in the second amplifying circuit.

On the other hand, when a "High" switching control signal is input from the switching control signal input terminal, the second switching circuit turns OFF. As a result of the second switching circuit turning OFF, no base bias current is supplied from the collector terminal of the second switching circuit to the base terminal of the second amplifying circuit, and hence the second amplifying circuit does not operate. Furthermore, as a result of the second switching circuit turning OFF, the collector potential decreases, and thereby the base potential of the first switching circuit decreases, that is, becomes "Low", which causes the first switching circuit to turn ON. As a result, a base bias current is supplied to the base terminal of the transistor of the first amplifying circuit, which is thus operated. The first amplifying circuit thereby oscillates a high-frequency signal with a resonant frequency based on the first resonant circuit, that is, in conjunction with the first resonant circuit, and outputs part of the high-frequency signal to the buffer circuit. The buffer circuit amplifies the high-frequency signal that has been input and outputs it to the output terminal.

Here, when the first switching circuit and the first amplifying circuit operate, the control-switching signal is "High". This does not allow the second switching circuit to operate, so that noise at the collector terminal of the second switching circuit is not transmitted. Furthermore, since the base terminal of the first switching circuit is "Low" in this case, no noise is superposed on a current flowing from the first switching circuit to the first amplifying circuit. Consequently, a high-frequency signal free from noise is input and amplified in the first amplifying circuit.

In the above-described high frequency oscillator, a third switching circuit may be disposed between the switching control signal input terminal and the second switching circuit. In this case, the third switching circuit includes an NPN transistor having a collector terminal connected to the base terminal of the PNP transistor of the second switching circuit, a grounded emitter terminal, and a base terminal connected to the switching control signal input terminal.

With the structure described above, when a "High" switching control signal is input from the switching control signal input terminal, the NPN transistor of the third switching circuit turns ON. In response to this, the PNP transistor of the second switching circuit turns ON. As a result, a base bias current is supplied to the NPN transistor of the second amplifying circuit, which is thus operated. Consequently, the second amplifying circuit oscillates a high-frequency signal with a resonant frequency based on the second resonant circuit, that is, in conjunction with the second resonant circuit, and outputs part of the high-frequency signal to the buffer circuit. The buffer circuit amplifies the high-frequency signal that has been input and outputs it to the output terminal. In this case, as a result of the second switching circuit operating, the base terminal of the PNP transistor of the first switching circuit becomes "High", and therefore the first switching circuit does not operate. Here, since the PNP transistor of the second switching circuit operates at "Low", noise that has superposed on the switching control signal is not transmitted to the output end of the second switching circuit. This ensures that a high-frequency signal free from noise is input and amplified in the second amplifying circuit.

On the other hand, when a "Low" switching control signal is input from the switching control signal input terminal, the third switching circuit and the second switching circuit do not operate. As a result, the second amplifying circuit does not operate. Furthermore, as a result of the second switching circuit not operating, the base terminal of the PNP transistor of the first switching circuit becomes "Low", which causes this PNP transistor to turn ON. Since the first switching circuit turns ON, a base bias current is supplied to the NPN transistor of the first amplifying circuit, which is thus operated. Consequently, the first amplifying circuit oscillates a high-frequency signal with a resonant frequency based on the first resonant circuit, that is, in conjunction with the first resonant circuit, and outputs part of the high-frequency signal to the buffer circuit. The buffer circuit amplifies the high-frequency signal that has been input and outputs it to the output terminal.

Here, since the second and third switching circuits are disposed between the first switching circuit and the switching control signal input terminal, a driving signal (a power) from the power terminal of each amplifying circuit and the buffer circuit is attenuated by the above-described switching circuits. This ensures that such a driving signal is not transmitted to the switching control signal input terminal. As a result, for example, even if a high load is connected to the switching control signal input terminal, no reverse current flows to this load, which ensures that a stable switching control signal is input.

In the above-described high frequency oscillator, at least the first switching circuit may include a PNP transistor.

With this structure, the switching circuit does not include a resistor, and consequently, the number of components in the switching circuit is reduced. As a result, the number of components in the high-frequency oscillator is decreased.

According to preferred embodiments of the present invention, the frequency-selective high-frequency oscillator that switches a high-frequency signal between two different frequencies by using a single switching control signal from a single switching control signal input terminal achieves stable operation and outputs a high-frequency signal with a high S/N ratio for both the frequencies.

Other features, elements, characteristics and advantages of the present invention will become more apparent from the following detailed description of preferred embodiments with reference to the attached drawings.

DETAILED DESCRIPTION OF PREFERRED EMBODIMENTS

Figure 1:
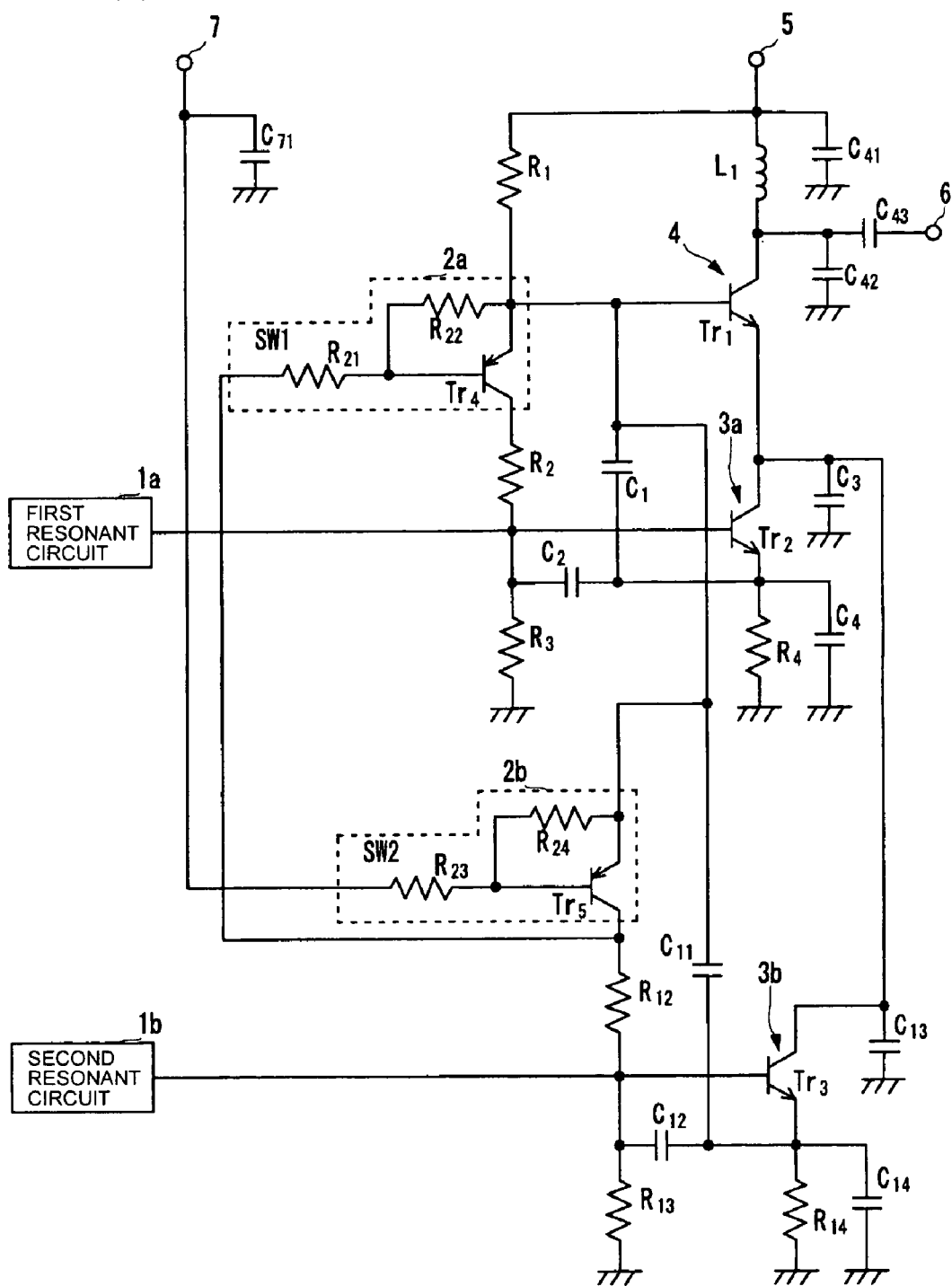
FIG. 1 is a circuit diagram of a frequency-selective high-frequency oscillator according to a first preferred embodiment of the present invention.

A frequency-selective high-frequency oscillator according to a first preferred embodiment of the present invention will now be described with reference to FIG. 1.

The frequency-selective high-frequency oscillator according to this preferred embodiment includes first and second resonant circuits 1a and 1b having different resonant frequencies from each other, first and second amplifying circuits 3a and 3b connected to the first and second resonant circuits 1a and 1b, respectively, first and second switching circuits 2a and 2b for switching the operation between the first and second amplifying circuits 3a and 3b, and a buffer circuit 4 that amplifies a high-frequency signal input from the first amplifying circuit 3a or the second amplifying circuit 3b and outputs the high-frequency signal from an output terminal 6a.

The first resonant circuit 1a is connected to the base terminal of an NPN transistor $Tr_2$ of the first amplifying circuit 3a, and the second resonant circuit 1b is connected to the base terminal of an NPN transistor $Tr_3$ of the second amplifying circuit 3b.

The collector terminal of the NPN transistor $Tr_2$ of the first amplifying circuit 3a is connected to the emitter terminal of an NPN transistor $Tr_1$ of the buffer circuit 4 and is also grounded via a capacitor $C_3$. The emitter terminal of the transistor $Tr_2$ is grounded via a parallel circuit defined by a resistor $R_4$ and a capacitor $C_4$, and is also connected to the base terminal of the transistor $Tr_1$ of the buffer circuit 4 via a capacitor $C_1$. The base terminal of the transistor $Tr_2$ is connected to a power terminal 5 via a series circuit defined by a resistor $R_1$ for supplying a bias current, the first switching circuit (SW1) 2a, and a resistor $R_2$ for supplying a bias current, and is also grounded via a resistor $R_3$ for supplying a bias current. Furthermore, a capacitor $C_2$ is connected between the base and the emitter of the transistor $Tr_2$.

The base terminal of the NPN transistor $Tr_1$ of the buffer circuit 4 is connected to a node between the resistor $R_1$ and the first switching circuit (SW1) 2a. The collector terminal of the transistor $Tr_1$ is connected to the power terminal 5 via an inductor $L_1$ and to the output terminal 6 via a capacitor $C_{43}$. Furthermore, the collector terminal of the transistor $Tr_1$ is grounded via a capacitor $C_{42}$ and the power terminal 5 is grounded via a capacitor $C_4$.

The collector terminal of the NPN transistor $Tr_3$ of the second amplifying circuit 3b is connected to the emitter terminal of the transistor $Tr_1$ of the buffer circuit 4 and is also grounded via a capacitor $C_{13}$. The emitter terminal of the transistor $Tr_3$ is grounded via a parallel circuit defined by of a resistor $R_{14}$ and a capacitor $C_{14}$ and is also connected to the base terminal of the transistor $Tr_1$ of the buffer circuit 4 via a capacitor $C_{11}$. The base terminal of the transistor $Tr_3$ is connected to the power terminal 5 via a series circuit defined by the resistor $R_1$ for supplying a bias current, the second switching circuit (SW2) 2b, and a resistor $R_{12}$ for supplying a bias current, and is also grounded via a resistor $R_{13}$ for supplying a bias current. Furthermore, a capacitor $C_{12}$ is connected between the base and the emitter of the transistor $Tr_3$.

The first switching circuit (SW1) 2a includes a PNP transistor $Tr_4$, a resistor $R_{22}$ connected between the base and the emitter of the transistor $Tr_4$, and a resistor $R_{21}$ connected to the base terminal of the transistor $Tr_4$. Furthermore, the emitter and the collector of the transistor $Tr_4$ are disposed between the resistors $R_1$ and $R_2$ such that the emitter terminal is connected to the resistor $R_1$ and the collector terminal is connected to the resistor $R_2$. Furthermore, the base terminal of the transistor $Tr_4$ is connected to the collector terminal of a transistor $Tr_5$ of the second switching circuit (SW2) 2b via the resistor $R_{21}$.

The second switching circuit (SW2) 2b includes the PNP transistor $Tr_5$, a resistor $R_{24}$ connected between the base and the emitter of the transistor $Tr_5$, and a resistor $R_{23}$ connected to the base terminal of the transistor $Tr_5$. Furthermore, the emitter and the collector of the transistor $Tr_5$ are disposed between the resistors $R_1$ and $R_{12}$ such that the emitter terminal is connected to the resistor $R_1$ and the collector terminal is connected to the resistor $R_{12}$. Furthermore, the base terminal of the transistor $Tr_5$ of the second switching circuit (SW2) 2b is connected to a switching control signal input terminal 7 via the resistor $R_{23}$, and this switching control signal input terminal 7 is grounded via a capacitor $C_{71}$.

The first switching circuit (SW1) 2a, the second switching circuit (SW2) 2b, and the switching control signal input terminal 7 define a selection circuit according to preferred embodiments of the present invention.

The operation of the frequency-selective high-frequency oscillator having the unique above-described structure will now be described.

(1) When the Switching Control Signal is "Low"

When a "Low" switching control signal is input to the second switching circuit (SW2) 2b, the base potential of the PNP transistor $Tr_5$ decreases to cause the transistor $Tr_5$ to turn ON. As a result, a base bias current is supplied to the base terminal of the transistor $Tr_3$ of the second amplifying circuit 3b connected to the collector terminal of the transistor $Tr_5$, and as a result, the transistor $Tr_3$ of the second amplifying circuit 3b operates. Consequently, the second amplifying circuit 3b oscillates a high-frequency signal with a resonant frequency $f_2$ based on the second resonant circuit 1b, that is, in conjunction with the second resonant circuit 1b, and outputs part of the high-frequency signal. The high frequency signal output from the transistor $Tr_3$ is transmitted to the transistor $Tr_1$ of the buffer circuit 4. The transistor $Tr_1$ amplifies the high-frequency signal that has been input and outputs it to the output terminal 6 via the capacitor $C_{43}$.

On the other hand, the base bias current that flows as a result of the transistor $Tr_5$ of the second switching circuit (SW2) 2b turning ON causes the potential at the collector terminal of the transistor $Tr_5$ to become high. Because of this, the base potential of the PNP transistor $Tr_4$ of the first switching circuit (SW1) 2a becomes high, which thereby causes the transistor $Tr_4$ to turn OFF. When the transistor $Tr_4$ turns OFF, no current flows between the emitter and the collector of the transistor $Tr_4$, that is, no base bias current is supplied to the base terminal of the transistor $Tr_2$ of the first amplifying circuit 3a. Thus, the transistor $Tr_2$ of the first amplifying circuit 3a does not operate.

(2) When the Switching Control Signal is "High"

When a "High" switching control signal is input to the second switching circuit (SW2) 2b, the base potential of the PNP transistor $Tr_5$ becomes high, and thereby the transistor $Tr_5$ turns OFF. For this reason, no current flows between the emitter and the collector of the transistor $Tr_5$, and hence no base bias current is supplied to the transistor $Tr_3$ of the second amplifying circuit 3b. As a result, the transistor $Tr_3$ of the second amplifying circuit 3b does not operate.

On the other hand, as a result of the transistor $Tr_5$ of the second switching circuit (SW2) 2b turning OFF, no current flows between the emitter and the collector of the transistor $Tr_5$, which causes the base potential of the PNP transistor $Tr_4$ of the first switching circuit (SW1) 2a, connected to the collector terminal of the transistor $Tr_5$, to become low and thereby the transistor $Tr_4$ to turn ON. When the transistor $Tr_4$ turns ON, a base bias current is supplied to the base terminal of the transistor $Tr_2$ of the first amplifying circuit 3a, and thereby the transistor $Tr_2$ Of the first amplifying circuit 3a operates. Consequently, the first amplifying circuit 3a oscillates a high-frequency signal with a resonant frequency $f_1$ based on the first resonant circuit 1a, that is, in conjunction with the first resonant circuit 1a, and outputs part of the high-frequency signal. The high frequency signal output from the transistor $Tr_2$ is transmitted to the transistor $Tr_1$ of the buffer circuit 4. The transistor $Tr_1$ amplifies the high-frequency signal that has been input and outputs it to the output terminal 6 via the capacitor $C_{43}$. In this case, since the transistor $Tr_5$ of the second switching circuit (SW2) 2b is OFF, even though noise coming from the switching control signal input terminal 7 is superposed on a "High" switching control signal, this noise is not transmitted to the first switching circuit (SW1) 2a.

With the structure described above, a signal that is input to the second switching circuit (SW2) 2b to operate the transistor $Tr_3$ of the second amplifying circuit 3b is "Low", and a signal that is input to the first switching circuit (SW1) 2a to operate the transistor $Tr_2$ of the first amplifying circuit 3a is also "Low". In other words, to cause the target amplifying circuit (whether it is the first amplifying circuit 3a or the second amplifying circuit 3b) to turn ON, a "Low" signal is input to the corresponding switching circuit. This ensures that no noise from the control signal input terminal 7 is transmitted to the target amplifying circuit. Consequently, a frequency-selective high-frequency oscillator that outputs a high-frequency signal with a high S/N ratio for both oscillation frequencies can be constructed.

Furthermore, with the above-described structure, the switching circuits are disposed in the respective base bias supplying circuits. This decreases the driving power. As a result, a frequency-selective high-frequency oscillator with low power consumption can be constructed.

In this preferred embodiment, the switching control signal input terminal 7 is connected to the base of the transistor $Tr_5$ of the second switching circuit (SW2) 2b, and the base of the transistor $Tr_4$ of the first switching circuit (SW1) 2a is connected to the collector of the transistor $Tr_5$. However, the switching control signal input terminal 7 may be connected to the base of the transistor $Tr_4$ of the first switching circuit (SW1) 2a, and the base of the transistor $Tr_5$ of the second switching circuit (SW2) 2b may be connected to the collector of the transistor $Tr_4$. As described above, the control logic can easily be inverted by reversing the connection between the first switching circuit (SW1) 2a and the second switching circuit (SW2) 2b.

A frequency-selective high-frequency oscillator according to a second preferred embodiment will now be described with reference to FIG. 2.

Figure 2:
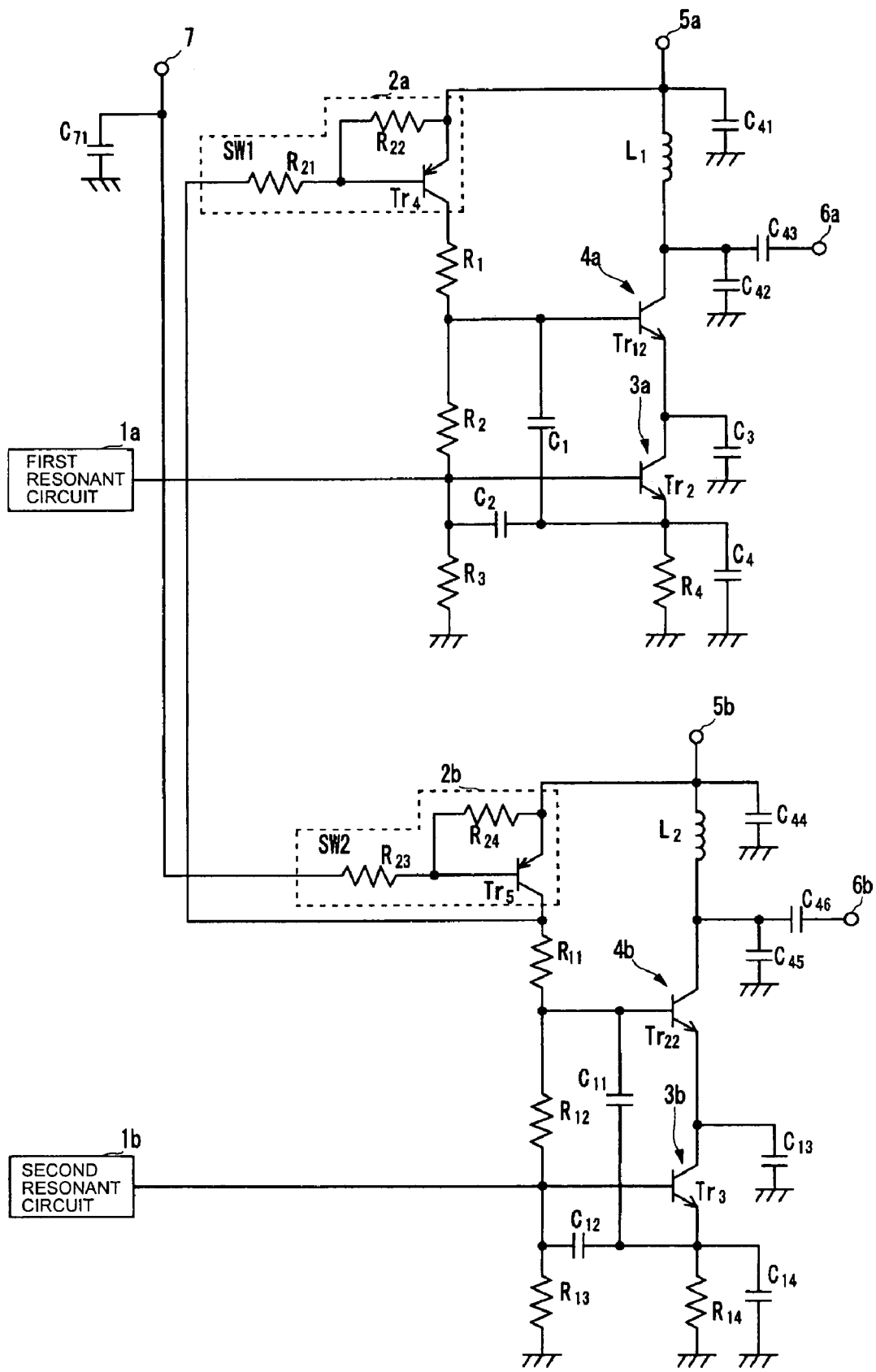
FIG. 2 is a circuit diagram of a frequency-selective high-frequency oscillator according to a second preferred embodiment of the present invention.

FIG. 2 is a circuit diagram of a frequency-selective high-frequency oscillator according to this preferred embodiment.

The frequency-selective high-frequency oscillator according to this preferred embodiment includes first and second resonant circuits 1a and 1b with different resonant frequencies from each other, first and second amplifying circuits 3a and 3b connected to the first and second resonant circuits 1a and 1b, respectively, first and second switching circuits 2a and 2b for switching the operation between the first and second amplifying circuits 3a and 3b, and first and second buffer circuits 4a and 4b that amplify high-frequency signals that have been input from the first and second amplifying circuits 3a and 3b, respectively, and output the high-frequency signals to output terminals 6a and 6b, respectively.

The collector terminal of an NPN transistor $Tr_2$ of the first amplifying circuit 3a is connected to the emitter terminal of an NPN transistor $Tr_{12}$ of the first buffer circuit 4a, and is also grounded via a capacitor $C_3$. The emitter terminal of the transistor $Tr_2$ is grounded via a parallel circuit defined by a resistor $R_4$ and a capacitor $C_4$, and is also connected to the base terminal of the NPN transistor $Tr_{12}$ of the first buffer circuit 4a via a capacitor $C_1$. The base terminal of the transistor $Tr_2$ is connected to a first power terminal 5a via a series circuit defined by the first switching circuit (SW1) 2a and resistors $R_1$ and $R_2$ for supplying a bias current, and is also grounded via a resistor $R_3$ for supplying a bias current.

Furthermore, a capacitor $C_2$ is connected between the base and the emitter of the transistor $Tr_2$.

The base terminal of the NPN transistor $Tr_{12}$ of the first buffer circuit 4a is connected to a node between the resistor $R_1$ and the resistor $R_2$. The collector terminal of the transistor $Tr_{12}$ is connected to the first power terminal 5a via an inductor $L_1$, and is also connected to the first output terminal 6a via a capacitor $C_{43}$. Furthermore, the collector terminal of the transistor $Tr_{12}$ is grounded via a capacitor $C_{42}$. The first power terminal 5a is grounded via a capacitor $C_{41}$.

The collector terminal of an NPN transistor $Tr_3$ of the second amplifying circuit 3b is connected to the emitter terminal of an NPN transistor $Tr_{22}$ of the second buffer circuit 4b, and is also grounded via a capacitor $C_{13}$. The emitter terminal of the transistor $Tr_3$ is grounded via a parallel circuit defined by a resistor $R_{14}$ and a capacitor $C_{14}$, and is also connected to the base terminal of the transistor $Tr_{22}$ of the second buffer circuit 4b via a capacitor $C_{11}$. The base terminal of the transistor $Tr_3$ is connected to a second power terminal 5b via a series circuit defined by the second switching circuit (SW2) 2b and resistors $R_{11}$ and $R_{12}$ for supplying a bias current, and is also grounded via a resistor $R_{13}$ for supplying a bias current. Furthermore, a capacitor $C_{12}$ is connected between the base and the emitter of the transistor $Tr_3$.

The base terminal of the NPN transistor $Tr_{22}$ of the second buffer circuit 4b is connected to a node between the resistor $R_{11}$ and the resistor $R_{12}$. The collector terminal of the transistor $Tr_{22}$ is connected to the second power terminal 5b via an inductor $L_2$, and is also connected to the second output terminal 6b via a capacitor $C_{46}$. Furthermore, the collector terminal of the transistor $Tr_{22}$ is grounded via a capacitor $C_{45}$. The second power terminal 5b is grounded via a capacitor $C_{44}$.

The structures of the first switching circuit (SW1) 2a and the second switching circuit (SW2) 2b, are the same as those in the frequency-selective high-frequency oscillator shown in the first preferred embodiment (refer to FIG. 1), except that the emitter terminal of the PNP transistor $Tr_4$ is connected to the first power terminal 5a, the collector terminal of the PNP transistor $Tr_4$ is connected to the resistor $R_1$, the emitter terminal of the PNP transistor $Tr_5$ is connected to the second power terminal 5b, and the collector terminal of the PNP transistor $Tr_5$ is connected to the resistor $R_{11}$. The connections between the first switching circuit (SW1) 2a and the second switching circuit (SW2) 2b are also preferably the same as in the first preferred embodiment.

As described above, in the frequency-selective high-frequency oscillator according to this preferred embodiment, the first and second amplifying circuit 3a and 3b are provided with the respective first and second buffer circuits 4a and 4b, the respective first and second power terminals 5a and 5b, and the respective first and second output terminals 6a and 6b. The remaining structure is the same as that of the frequency-selective high-frequency oscillator shown in the first preferred embodiment.

This structure can also achieve the same advantages as those shown in the above-described preferred embodiment.

A frequency-selective high-frequency oscillator according to a third preferred embodiment will now be described with reference to FIG. 3.

Figure 3:
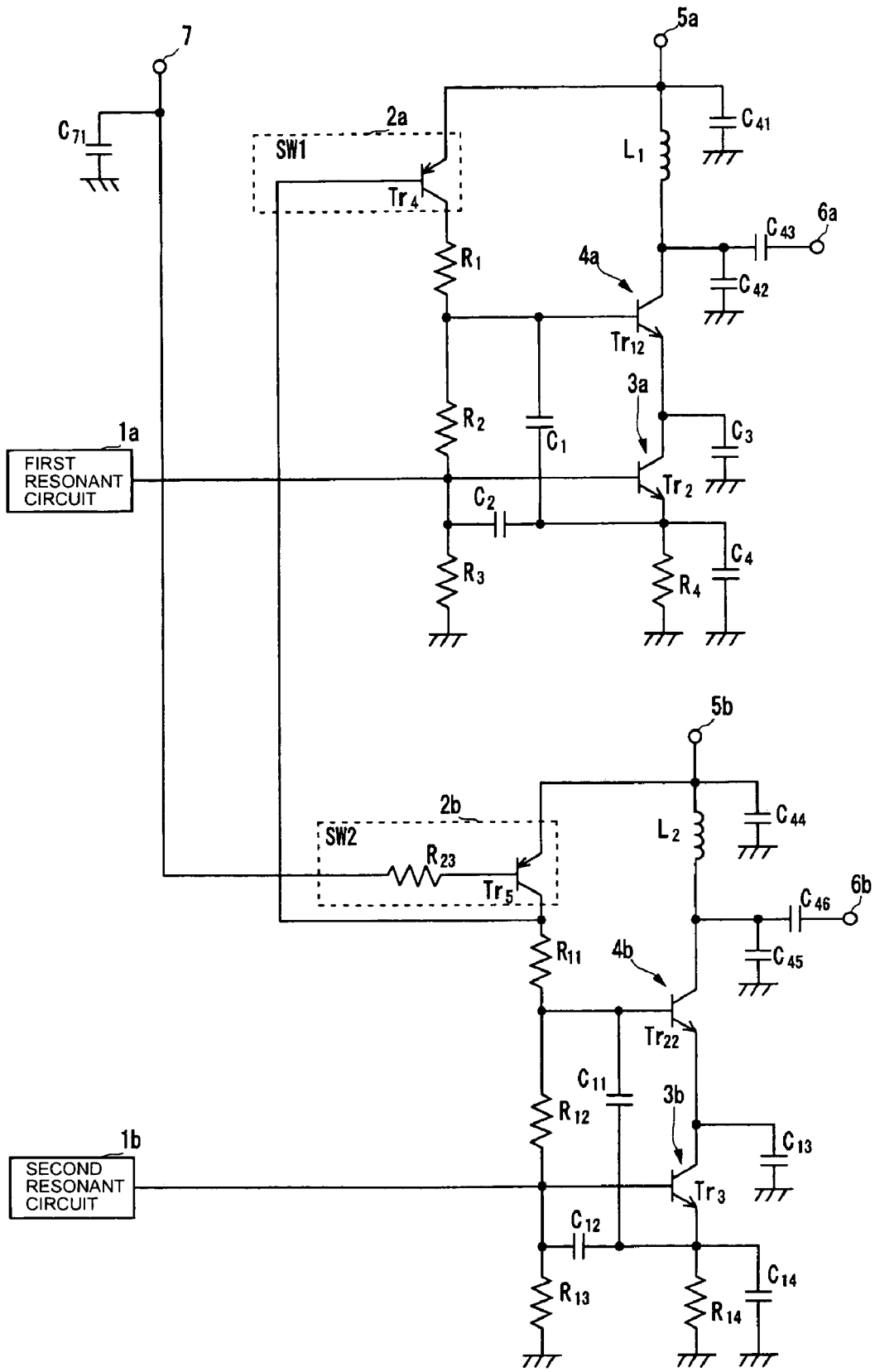
FIG. 3 is a circuit diagram of a frequency-selective high-frequency oscillator according to a third preferred embodiment of the present invention.

FIG. 3 is a circuit diagram of a frequency-selective high-frequency oscillator according to this preferred embodiment.

In the frequency-selective high-frequency oscillator shown in FIG. 3, a first switching circuit 2a preferably includes of a PNP transistor $Tr_4$ and a second switching circuit 2b includes a PNP transistor $Tr_5$ and a resistor $R_{23}$ connected to the base terminal of this transistor $Tr_5$. The remaining structure is preferably the same as that of the frequency-selective high-frequency oscillator shown in the second preferred embodiment (FIG. 2).

This structure can also achieve the same advantages as those shown in the above-described preferred embodiment.

A frequency-selective high-frequency oscillator according to a fourth preferred embodiment will now be described with reference to FIG. 4.

Figure 4:
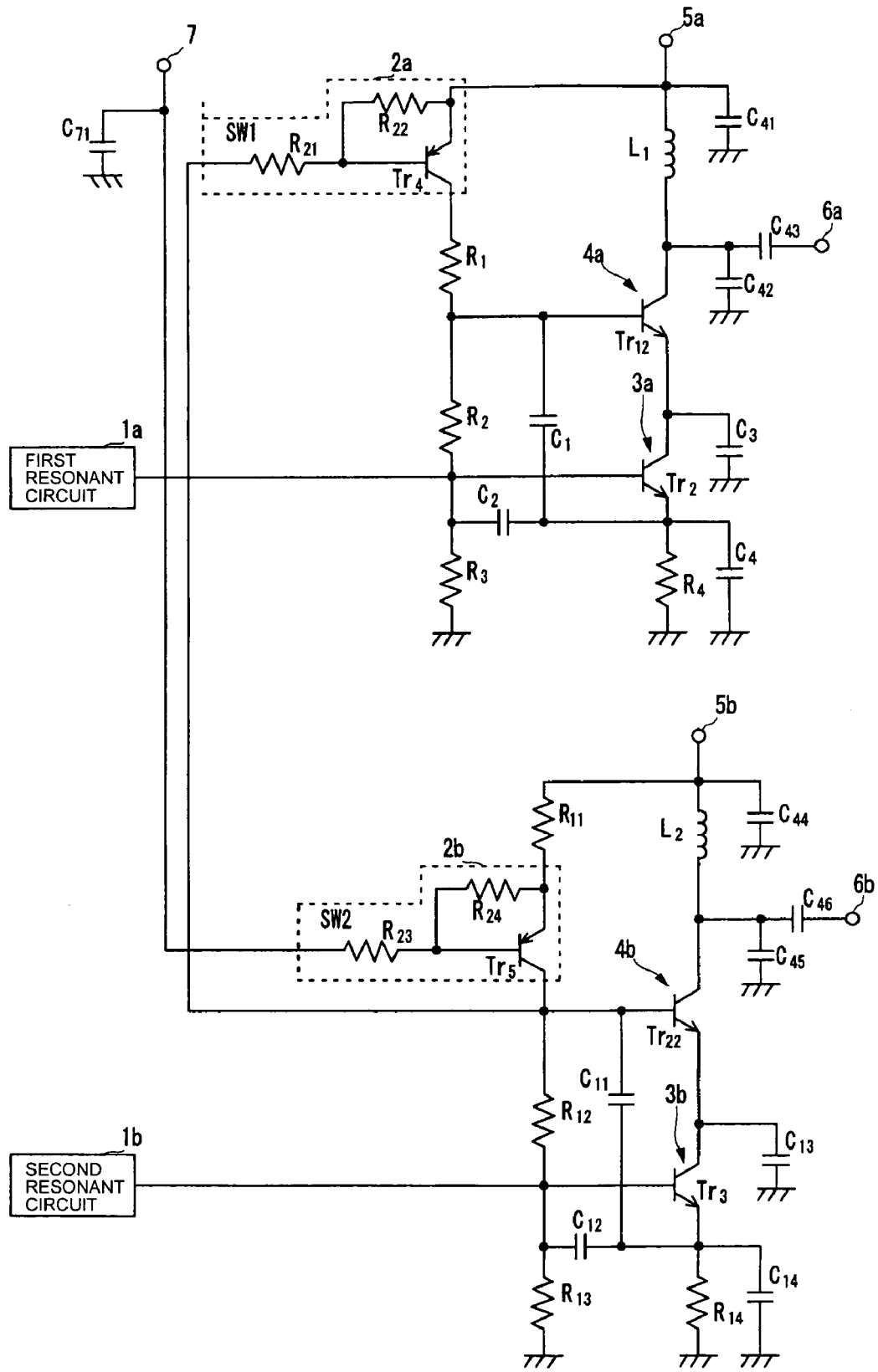
FIG. 4 is a circuit diagram of a frequency-selective high-frequency oscillator according to a fourth preferred embodiment of the present invention.

FIG. 4 is a circuit diagram of a frequency-selective high-frequency oscillator according to this preferred embodiment.

In the frequency-selective high-frequency oscillator shown in FIG. 4, a second switching circuit (SW2) 2b is connected between resistors $R_{11}$ and $R_{12}$ such that the emitter terminal of a PNP transistor $Tr_5$ is connected to the resistor $R_{11}$ and the collector terminal of the transistor $Tr_5$ is connected to the resistor $R_{12}$. The remaining structure is preferably the same as that of the frequency-selective high-frequency oscillator shown in the second preferred embodiment (FIG. 2).

This structure can also achieve the same advantages as those shown in the above-described preferred embodiment.

A frequency-selective high-frequency oscillator according to a fifth preferred embodiment will now be described with reference to FIG. 5.

Figure 5:
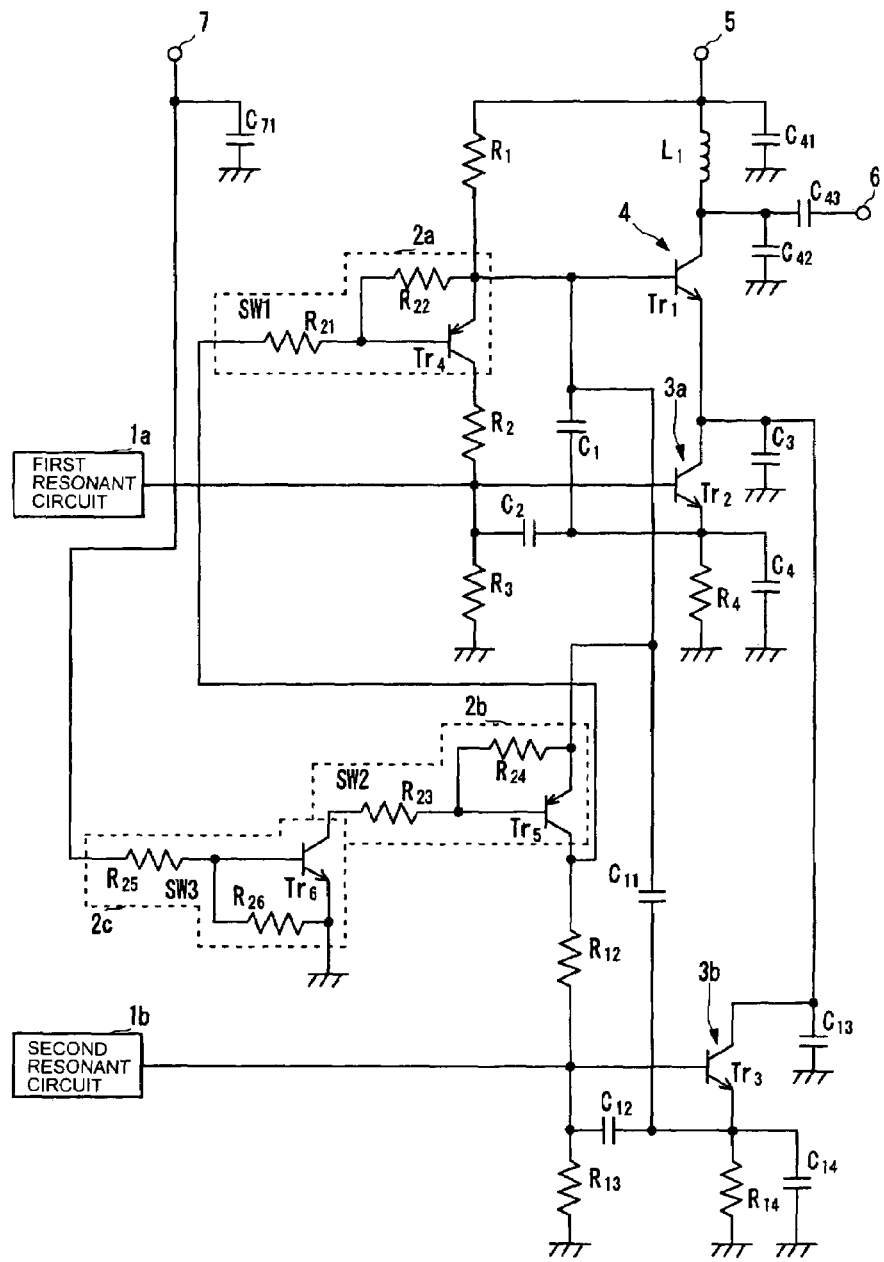
FIG. 5 is a circuit diagram of a frequency-selective high-frequency oscillator according to a fifth preferred embodiment of the present invention.

FIG. 5 is a circuit diagram of a frequency-selective high-frequency oscillator according to this preferred embodiment.

The frequency-selective high-frequency oscillator according to this preferred embodiment includes first and second resonant circuits 1a and 1b with different resonant frequencies from each other, first and second amplifying circuits 3a and 3b connected to the first and second resonant circuits 1a and 1b, respectively, first and second switching circuits 2a and 2b for switching the operation between the first and second amplifying circuits 3a and 3b, a third switching circuit 2c connected between the second switching circuits 2b and a switching control signal input terminal 7, and a buffer circuit 4 that amplifies a high-frequency signal that has been input from the first amplifying circuit 3a or the second amplifying circuit 3b and outputs the high-frequency signal to an output terminal 6.

The first resonant circuit 1a is connected to the base terminal of an NPN transistor $Tr_2$ Of the first amplifying circuit 3a, and the second resonant circuit 1b is connected to the base terminal of an NPN transistor $Tr_3$ of the second amplifying circuit 3b.

The collector terminal of the NPN transistor $Tr_2$ of the first amplifying circuit 3a is connected to the emitter terminal of an NPN transistor $Tr_1$ of the buffer circuit 4, and is also grounded via a capacitor $C_3$. The emitter terminal of the transistor $Tr_2$ is grounded via a parallel circuit defined by a resistor $R_4$ and a capacitor $C_4$, and is also concerted to the base terminal of the transistor $Tr_1$ of the buffer circuit 4 via a capacitor $C_1$. The base terminal of the transistor $Tr_2$ is connected to a power terminal 5 via a series circuit defined by a resistor $R_1$ for supplying a bias current, the first switching circuit (SW1) 2a, and a resistor $R_2$ for supplying a bias current, and is also grounded via a resistor $R_3$ for supplying a bias current. Furthermore, a capacitor $C_2$ is connected between the base and the emitter of the transistor $Tr_2$.

The base terminal of the NPN transistor $Tr_1$ of the buffer circuit 4 is connected to a node between the resistor $R_1$ and the first switching circuit (SW1) 2a. The collector terminal of the transistor $Tr_1$ is connected to the power terminal 5 via an inductor $L_1$, and is also connected to the output terminal 6 via a capacitor $C_{43}$. Furthermore, the collector terminal of the transistor $Tr_1$ is grounded via a capacitor $C_{42}$. Furthermore, the power terminal 5 is grounded via a capacitor $C_{41}$.

The collector terminal of an NPN transistor $Tr_3$ of the second amplifying circuit 3b is connected to the emitter terminal of the NPN transistor $Tr_1$ of the buffer circuit 4, and is also grounded via a capacitor $C_{13}$. The emitter terminal of the transistor $Tr_3$ is grounded via a parallel circuit defined by a resistor $R_{14}$ and a capacitor $C_{14}$ and is also connected to the base terminal of the transistor $Tr_1$ of the buffer circuit 4 via a capacitor $C_{11}$. The base terminal of the transistor $Tr_3$ is connected to the power terminal 5 via a series circuit defined by the resistor $R_1$ for supplying a bias current, the second switching circuit (SW2) 2b, and a resistor $R_{12}$ for supplying a bias current, and is also grounded via a resistor $R_{13}$ for supplying a bias current. Furthermore, a capacitor $C_{12}$ is connected between the base and the emitter of the transistor $Tr_3$.

The first switching circuit (SW1) 2a includes a PNP transistor $Tr_4$, a resistor $R_{22}$ connected between the base and the emitter of the transistor $Tr_4$, and a resistor $R_{21}$ connected to the base terminal of the transistor $Tr_4$. Furthermore, the emitter and the collector of the transistor $Tr_4$ are disposed between the resistors $R_1$ and $R_2$ such that the emitter terminal is connected to the resistor $R_1$ and the collector terminal is connected to the resistor $R_2$.

The second switching circuit (SW2) 2b includes a PNP transistor $Tr_5$, a resistor $R_{24}$ connected between the base and the emitter of the transistor $Tr_5$, and a resistor $R_{23}$ connected to the base terminal of the transistor $Tr_5$. Furthermore, the emitter and the collector of the transistor $Tr_5$ are disposed between the resistors $R_1$ and $R_{12}$ such that the emitter terminal is connected to the resistor $R_1$ and the collector terminal is connected to the resistor $R_{12}$.

Furthermore, the resistor $R_{21}$ connected to the base terminal of the transistor $Tr_4$ of the first switching circuit (SW1) 2a is connected to the collector terminal of the transistor $Tr_5$ of the second switching circuit (SW2) 2b.

The third switching circuit (SW3) 2c includes an NPN transistor $Tr_6$, a resistor $R_{26}$ connected between the base and the emitter of the transistor $Tr_6$, and a resistor $R_{25}$ connected to the base terminal of the transistor $Tr_6$. The emitter terminal of the transistor $Tr_6$ is grounded, and the collector terminal of the transistor $Tr_6$ is connected to the resistor $R_{23}$ connected to the base terminal of the transistor $Tr_5$ of the second switching circuit (SW2) 2b. Furthermore, the base terminal of the transistor $Tr_6$ of the third switching circuit (SW3) 2c is connected to the switching control signal input terminal 7 via the resistor $R_{25}$. This switching control signal input terminal 7 is grounded via a capacitor $C_{71}$. Here, the first switching circuit (SW1) 2a, the second switching circuit (SW2) 2b, the third switching circuit (SW3) 2c, and the switching control signal input terminal 7 define a selection circuit according to preferred embodiments of the present invention.

As described above, the high-frequency oscillator according to this preferred embodiment additionally includes the third switching circuit (SW3) 2c including the NPN transistor $Tr_6$, between the second switching circuit (SW2) 2b and the switching control signal input terminal 7 of the high-frequency oscillator shown in the first preferred embodiment of the present invention.

The operation of the frequency-selective high-frequency oscillator with this structure will now be described.

(1) When the Switching Control Signal is "High"

When a "High" switching control signal is input to the third switching circuit (SW3) 2c, a bias current flows between the base and the emitter of the NPN transistor $Tr_6$ to cause the NPN transistor $Tr_6$ to turn ON, which thereby causes a current to flow between the collector and the emitter. As a result, a bias current flows through the second switching circuit (SW2) 2b connected to the collector terminal of the transistor $Tr_6$, and thereby the base terminal of the PNP transistor $Tr_5$ is grounded via the resistor $R_{23}$ to a low potential ("Low"). As a result of the potential at the base terminal of the PNP transistor $Tr_5$ decreasing to substantially the ground level, the PNP transistor $Tr_5$ turns ON, and thereby the second switching circuit (SW2) 2b turns ON. Thus, a current flows between the emitter and the collector of the transistor $Tr_5$, and a base bias current is supplied to the base terminal of the NPN transistor $Tr_3$ of the second amplifying circuit 3b via the resistor $R_{12}$.

Consequently, the transistor $Tr_3$ operates, and thereby the second amplifying circuit 3b oscillates at a resonant frequency $f_2$ based on the second resonant circuit 1b, that is, in conjunction with the second resonant circuit 1, and outputs the oscillated signal.

On the other hand, as a result of the second switching circuit 2b turning ON, a voltage drop occurs across the resistors $R_{12}$ and $R_{13}$, which causes the potential at the collector terminal of the transistor $Tr_5$ of the second switching circuit (SW2) 2b to become high. As a result, the base potential of the PNP transistor $Tr_4$ of the first switching circuit (SW1) 2a increases, the transistor $Tr_4$ turns OFF, and no current flows between the emitter and the collector of the transistor $Tr_4$. Consequently, no base bias current is supplied to the NPN transistor $Tr_2$ of the first amplifying circuit 3a, and therefore, the transistor $Tr_2$ does not operate.

The high-frequency signal output from the transistor $Tr_3$ of the second amplifying circuit 3b is transmitted to the NPN transistor $Tr_1$ of the buffer circuit 4. The transistor $Tr_1$ amplifies the high-frequency signal that has been input and outputs it to the output terminal 6 via the capacitor $C_{43}$.

With this structure, when the switching control signal is "High", the third switching circuit (SW3) 2c turns ON, which causes the second switching circuit (SW2) 2b to turn ON due to a decrease in the base potential of the PNP transistor $Tr_5$. Consequently, a base bias current is supplied to the second amplifying circuit 3b. For this reason, even if noise is superposed on a switching control signal, the noise is not superposed on the base bias current because the transistor $Tr_5$ of the second switching circuit (SW2) 2b is ON at "Low". Thus, no noise is input to the second amplifying circuit 3b, and the S/N ratio of the high-frequency signal output from the second amplifying circuit 3b does not decrease. In short, a high-frequency signal with a high S/N ratio can be amplified and output.

(2) When the Switching Control Signal is "Low"

When a "Low" switching control signal is input to the third switching circuit (SW3) 2c, no bias current flows between the base and the emitter of the NPN transistor $Tr_6$, which causes the transistor $Tr_6$ to turn OFF. As a result, the base terminal of the PNP transistor $Tr_5$ of the second switching circuit (SW2) 2b connected to the collector terminal of the transistor $Tr_6$ is kept at a high potential, and the transistor $Tr_5$ turns OFF. When the transistor $Tr_5$ turns OFF, no current flows between the emitter and the collector of the transistor $Tr_5$, and hence no base bias current is supplied to the transistor $Tr_3$. For this reason, the transistor $Tr_3$ of the second amplifying circuit 3b does not operate.

On the other hand, since the base bias current of the transistor $Tr_3$ (current from the emitter to the collector of the transistor $Tr_5$) does not flow, no voltage drop occurs across the resistors $R_{12}$ and $R_{13}$, which causes the potential at the collector terminal of the transistor $Tr_5$ to decrease to the ground potential. Thus, the base potential of the PNP transistor $Tr_4$ of the first switching circuit (SW1) 2a decreases, so that the transistor $Tr_4$ turns ON. As a result, a current flows between the emitter and the collector of the transistor $Tr_4$, and a base bias current is supplied to the NPN transistor $Tr_2$ of the first amplifying circuit 3a to cause the transistor $Tr_2$ to operate.

Consequently, the first amplifying circuit 3a oscillates at a resonant frequency f, based on the first resonant circuit 1a, that is, in conjunction with the first resonant circuit 1a, and outputs part of the high-frequency signal. The high frequency signal output from the transistor $Tr_2$ is transmitted to the transistor $Tr_1$ of the buffer circuit 4. The transistor $Tr_1$ amplifies the high-frequency signal that has been input and outputs it to the output terminal 6 via the capacitor $C_{43}$.

With this structure, since the switching control signal is "Low", no noise is superposed. Furthermore, since the PNP transistor $Tr_4$ of the first switching circuit (SW1) 2a turns ON at "Low", no noise is input to the NPN transistor $Tr_2$ of the first amplifying circuit 3a. This prevents the S/N ratio of the high-frequency signal output from the first amplifying circuit 3a from decreasing. In short, a high-frequency signal with a high S/N ratio can be amplified and output.

With this structure, the base terminal of the first switching circuit (SW1) 2a is not connected to the switching control signal input terminal 7. Instead, the switching control signal input terminal 7 is connected to the base terminal of the NPN transistor $Tr_6$. For this reason, even if the switching control signal becomes "Low", no current flows from the power terminal 5 to the switching control signal input terminal 7. Because of this, for example, even if a high-load circuit is connected to the switching control signal input terminal 7, a stable switching control signal is input because the switching control signal is not adversely affected.

As described above, with the circuit structure according to this preferred embodiment, the frequency-selective high-frequency oscillator that switches the oscillation of a high-frequency signal between two different frequencies by using a single switching control signal from a single switching control signal input terminal can exhibit stable operation and output a high-frequency signal with a high S/N ratio for both the oscillation frequencies.

A frequency-selective high-frequency oscillator according to a sixth preferred embodiment will now be described with reference to FIG. 6.

Figure 6:
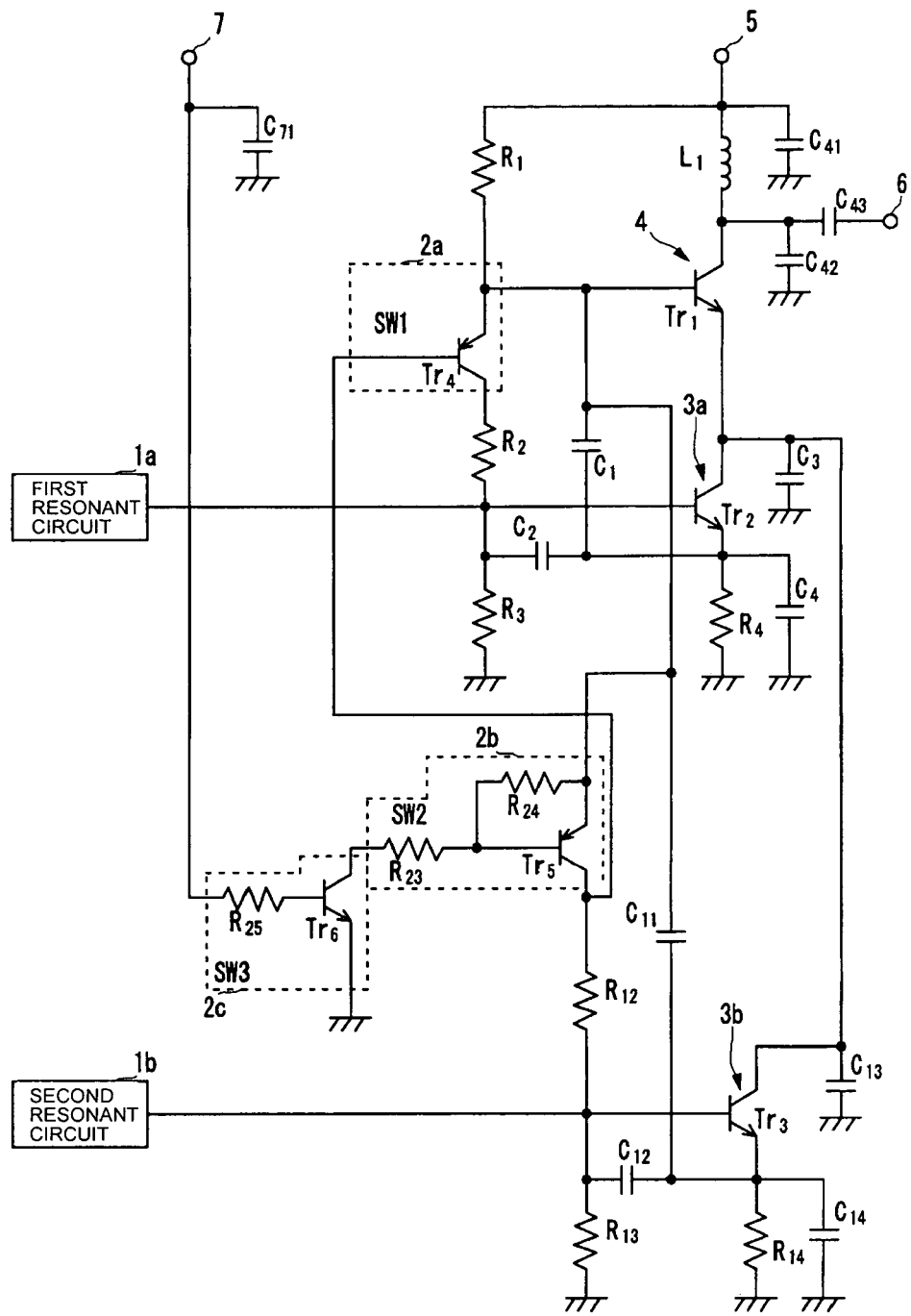
FIG. 6 is a circuit diagram of a frequency-selective high-frequency oscillator according to a sixth preferred embodiment of the present invention.

FIG. 6 is a circuit diagram of a frequency-selective high-frequency oscillator according to this preferred embodiment. In FIG. 6, the same circuit components as those in the frequency-selective high-frequency oscillator shown in the fifth preferred embodiment (FIG. 5) have the same reference numerals.

In the frequency-selective high-frequency oscillator shown in FIG. 6, a first switching circuit (SW1) 2a preferably includes a PNP transistor $Tr_4$, a second switching circuit (SW2) 2b includes a PNP transistor $Tr_5$, a resistor $R_{24}$ connected between the base and the emitter of this transistor $Tr_5$, and a resistor $R_{23}$ connected to the base terminal of the transistor $Tr_5$, and a third switching circuit (SW3) 2c includes an NPN transistor $Tr_6$ and a resistor $R_{25}$ connected to the base terminal of this transistor $Tr_6$. The remaining structure is preferably the same as that of the frequency-selective high-frequency oscillator shown in FIG. 5.

This structure can also achieve the same advantages as those shown in the above-described fifth preferred embodiment. In addition, the switching circuits 2a, 2b, and 2c have a greatly simplified construction. This advantageously enables a frequency-selective high-frequency oscillator with a simple structure to be constructed.

A frequency-selective high-frequency oscillator according to a seventh preferred embodiment will now be described with reference to FIG. 7.

Figure 7:
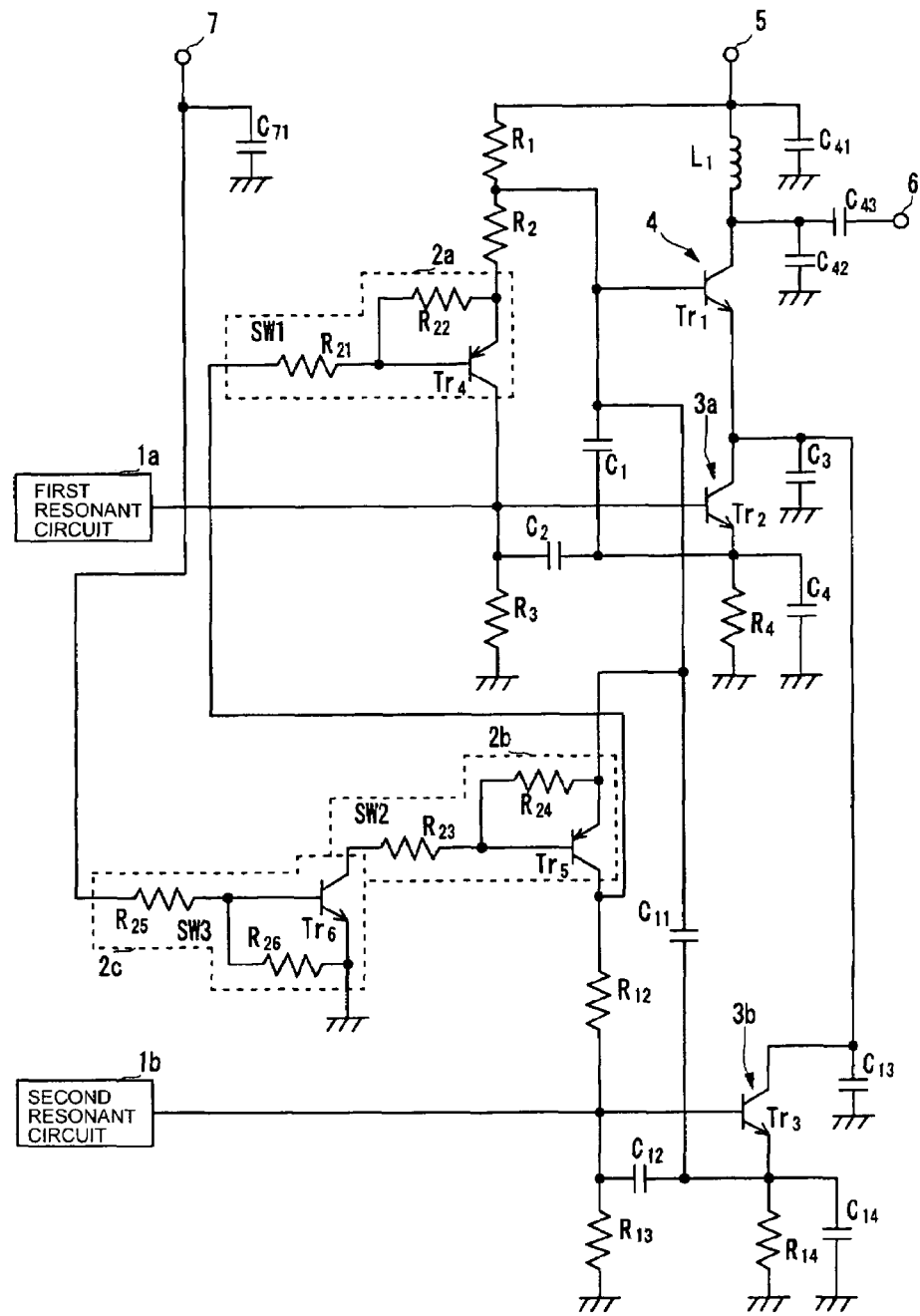
FIG. 7 is a circuit diagram of a frequency-selective high-frequency oscillator according to a seventh preferred embodiment of the present invention.

FIG. 7 is a circuit diagram of a frequency-selective high-frequency oscillator according to this preferred embodiment. In FIG. 7, the same circuit components as those in the frequency-selective high-frequency oscillator shown in the fifth preferred embodiment (FIG. 5) have the same reference numerals.

In the frequency-selective high-frequency oscillator shown in FIG. 7, a PNP transistor $Tr_4$ of a first switching circuit (SW1) 2a is disposed between resistors $R_2$ and $R_3$ such that the emitter terminal of the transistor $Tr_4$ is connected to the resistor $R_2$ and the collector terminal of the transistor $Tr_4$ is connected to the resistor $R_3$. The remaining structure is preferably the same as that of the frequency-selective high-frequency oscillator shown in FIG. 5.

This structure can also achieve the same advantages as those shown in the above-described fifth preferred embodiment.

A frequency-selective high-frequency oscillator according to an eighth preferred embodiment will now be described with reference to FIG. 8.

Figure 8:
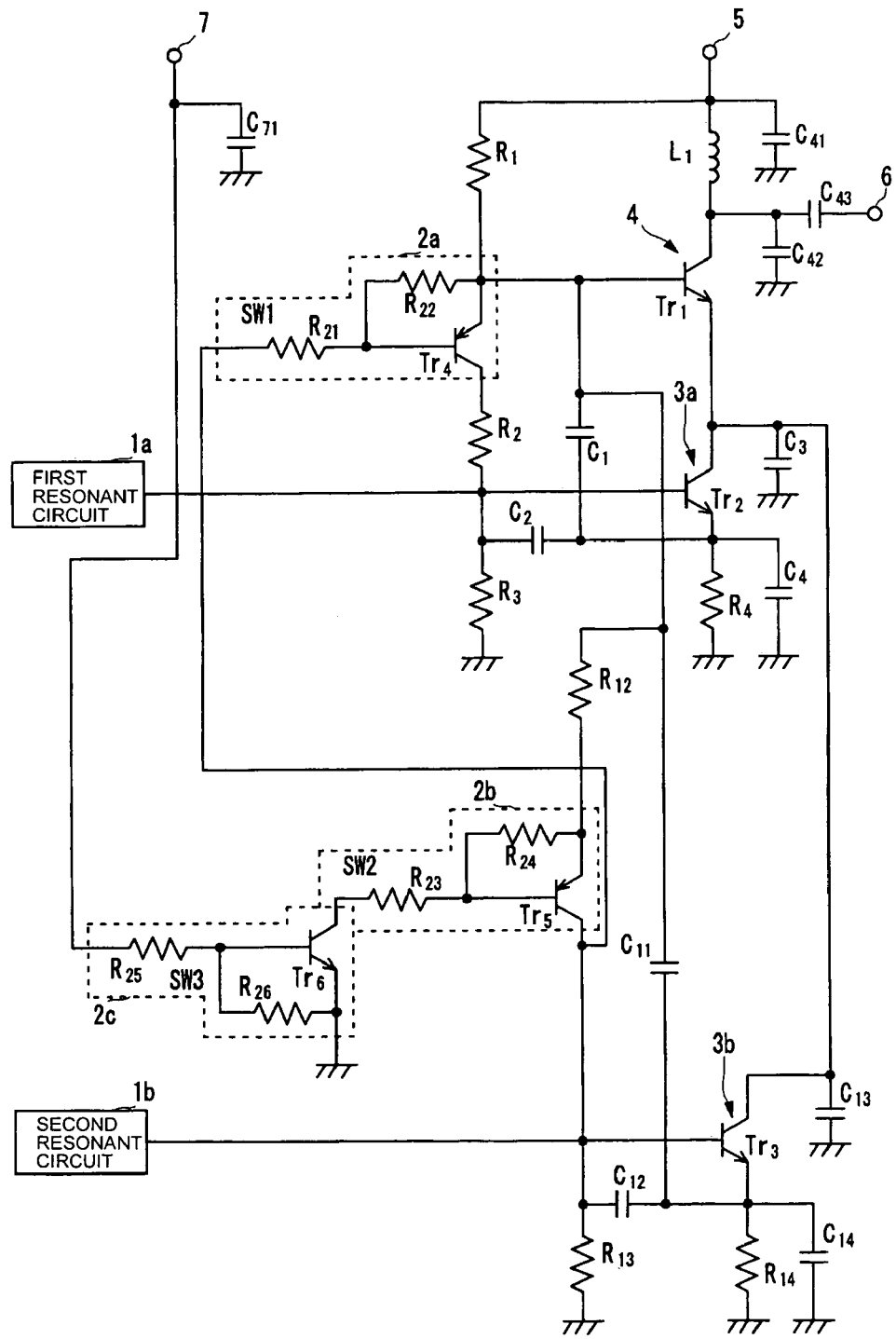
FIG. 8 is a circuit diagram of a frequency-selective high-frequency oscillator according to an eighth preferred embodiment of the present invention.

FIG. 8 is a circuit diagram of a frequency-selective high-frequency oscillator according to this preferred embodiment. In FIG. 8, the same circuit components as those in the frequency-selective high-frequency oscillator shown in the fifth preferred embodiment (FIG. 5) have the same reference numerals.

In the frequency-selective high-frequency oscillator shown in FIG. 8, a PNP transistor $Tr_5$ of a second switching circuit (SW2) 2b is disposed between the resistors $R_{12}$ and $R_{13}$ such that the emitter terminal of the transistor $Tr_5$ is connected to the resistor $R_{12}$ and the collector terminal of the transistor $Tr_5$ is connected to the resistor $R_{13}$. The remaining structure is preferably the same as that of the frequency-selective high-frequency oscillator shown in FIG. 5.

This structure can also achieve the same advantages as those shown in the above-described fifth preferred embodiment.

A frequency-selective high-frequency oscillator according to a ninth preferred embodiment will now be described with reference to FIG. 9.

Figure 9:
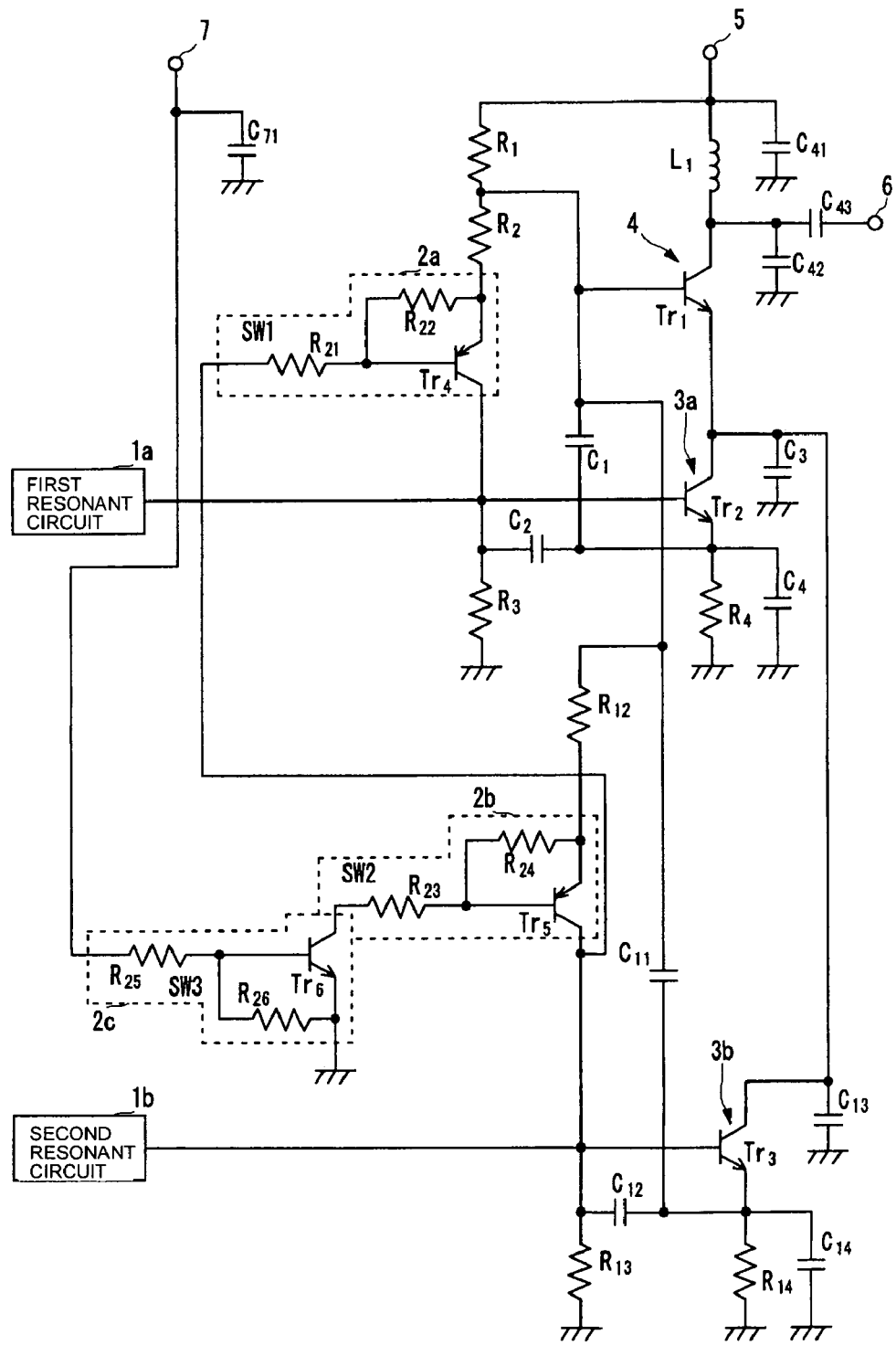
FIG. 9 is a circuit diagram of a frequency-selective high-frequency oscillator according to a ninth preferred embodiment of the present invention.

FIG. 9 is a circuit diagram of a frequency-selective high-frequency oscillator according to this preferred embodiment. In FIG. 9, the same circuit components as those in the frequency-selective high-frequency oscillator shown in the fifth preferred embodiment (FIG. 5) have the same reference numerals.

In the frequency-selective high-frequency oscillator shown in FIG. 9, a PNP transistor $Tr_4$ of a first switching circuit (SW1) 2a is disposed between resistors $R_2$ and $R_3$ such that the emitter terminal of the transistor $Tr_4$ is connected to the resistor $R_2$ and the collector terminal of the transistor $Tr_4$ is connected to the resistor $R_3$. Furthermore, in the frequency-selective high-frequency oscillator shown in FIG. 9, a PNP transistor $Tr_5$ of a second switching circuit (SW2) 2b is disposed between resistors $R_{12}$ and $R_{13}$ such that the emitter terminal of the transistor $Tr_5$ is connected to the resistor $R_{12}$ and the collector terminal is connected to the resistor $R_{13}$. The remaining structure is the same as that of the frequency-selective high-frequency oscillator shown in FIG. 5.

This structure can also achieve the same advantages as those shown in the above-described fifth preferred embodiment.

A frequency-selective high-frequency oscillator according to a tenth preferred embodiment will now be described with reference to FIG. 10.

Figure 10:
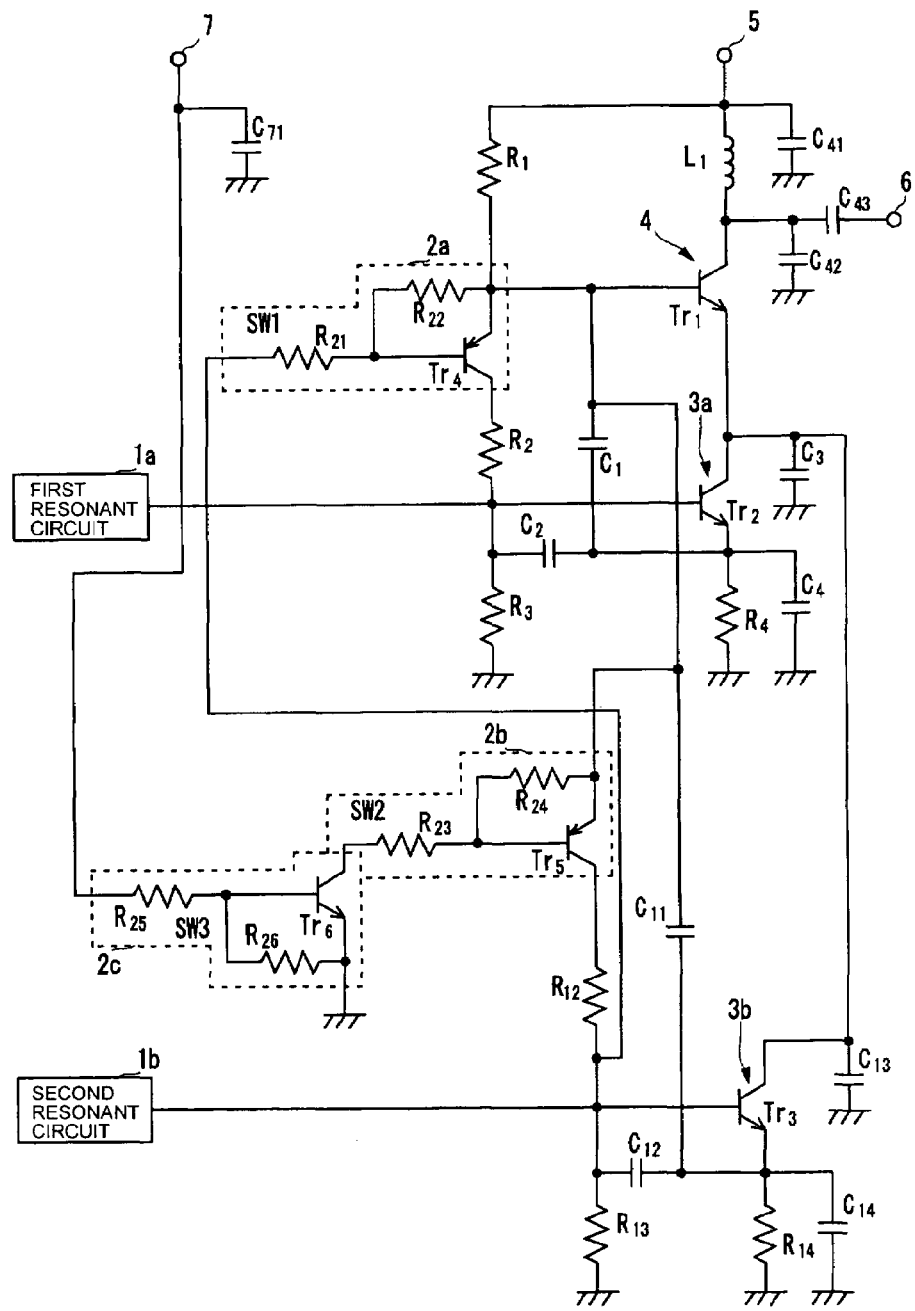
FIG. 10 is a circuit diagram of a frequency-selective high-frequency oscillator according to a tenth preferred embodiment of the present invention.

FIG. 10 is a circuit diagram of a frequency-selective high-frequency oscillator according to this preferred embodiment. In FIG. 10, the same circuit components as those in the frequency-selective high-frequency oscillator shown in the fifth preferred embodiment (FIG. 5) have the same reference numerals.

In the frequency-selective high-frequency oscillator shown in FIG. 10, one end of a resistor $R_{21}$ of a first switching circuit (SW1) 2$a$ is connected between resistors $R_{12}$ and $R_{13}$. The remaining structure is the same as that of the frequency-selective high-frequency oscillator shown in FIG. 5.

This structure can also achieve the same advantages as those shown in the above-described fifth preferred embodiment.

A frequency-selective high-frequency oscillator according to an eleventh preferred embodiment will now be described with reference to FIG. 11.

Figure 11:
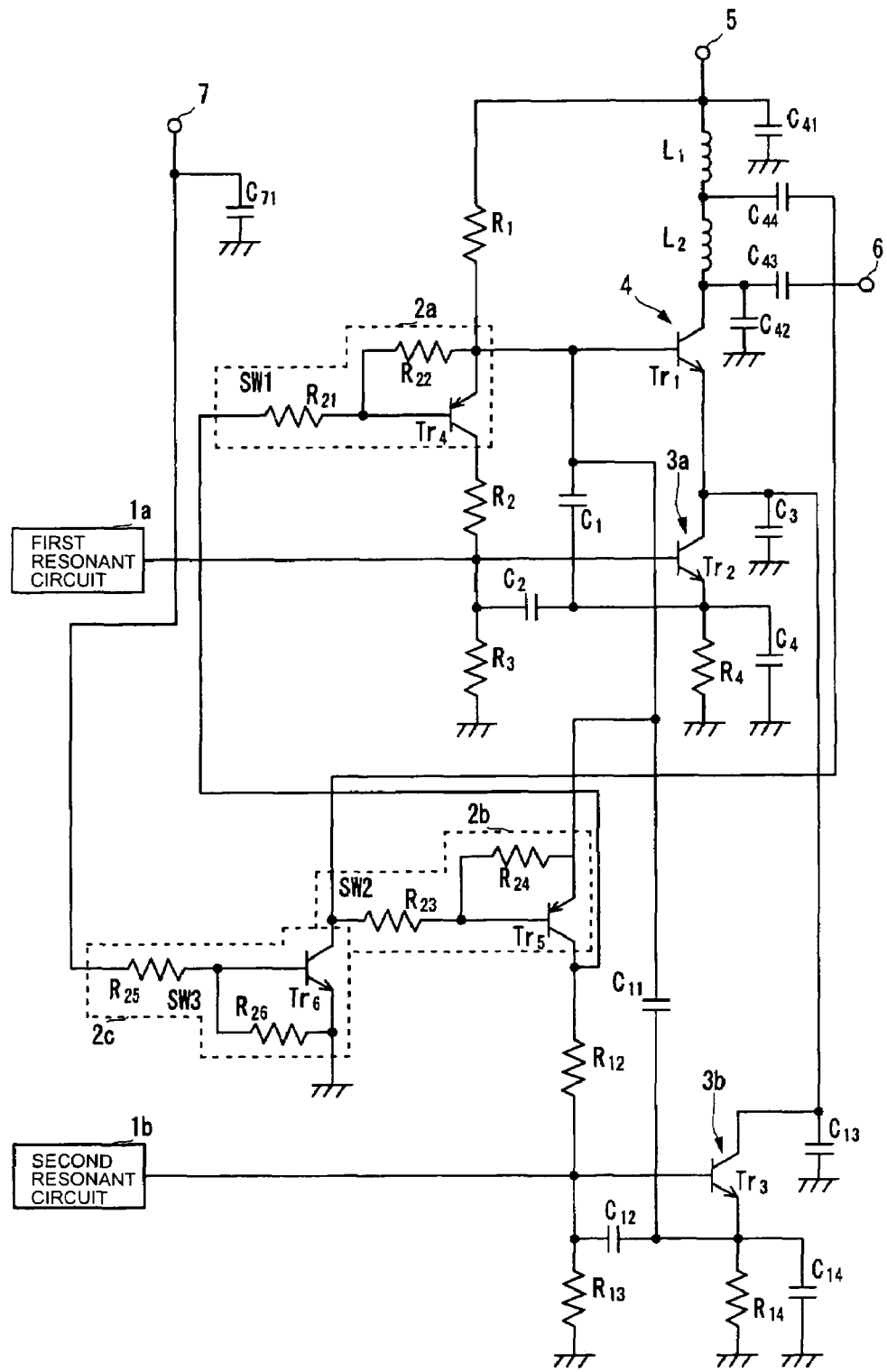
FIG. 11 is a circuit diagram of a frequency-selective high-frequency oscillator according to an eleventh preferred embodiment of the present invention.
Figure 12:
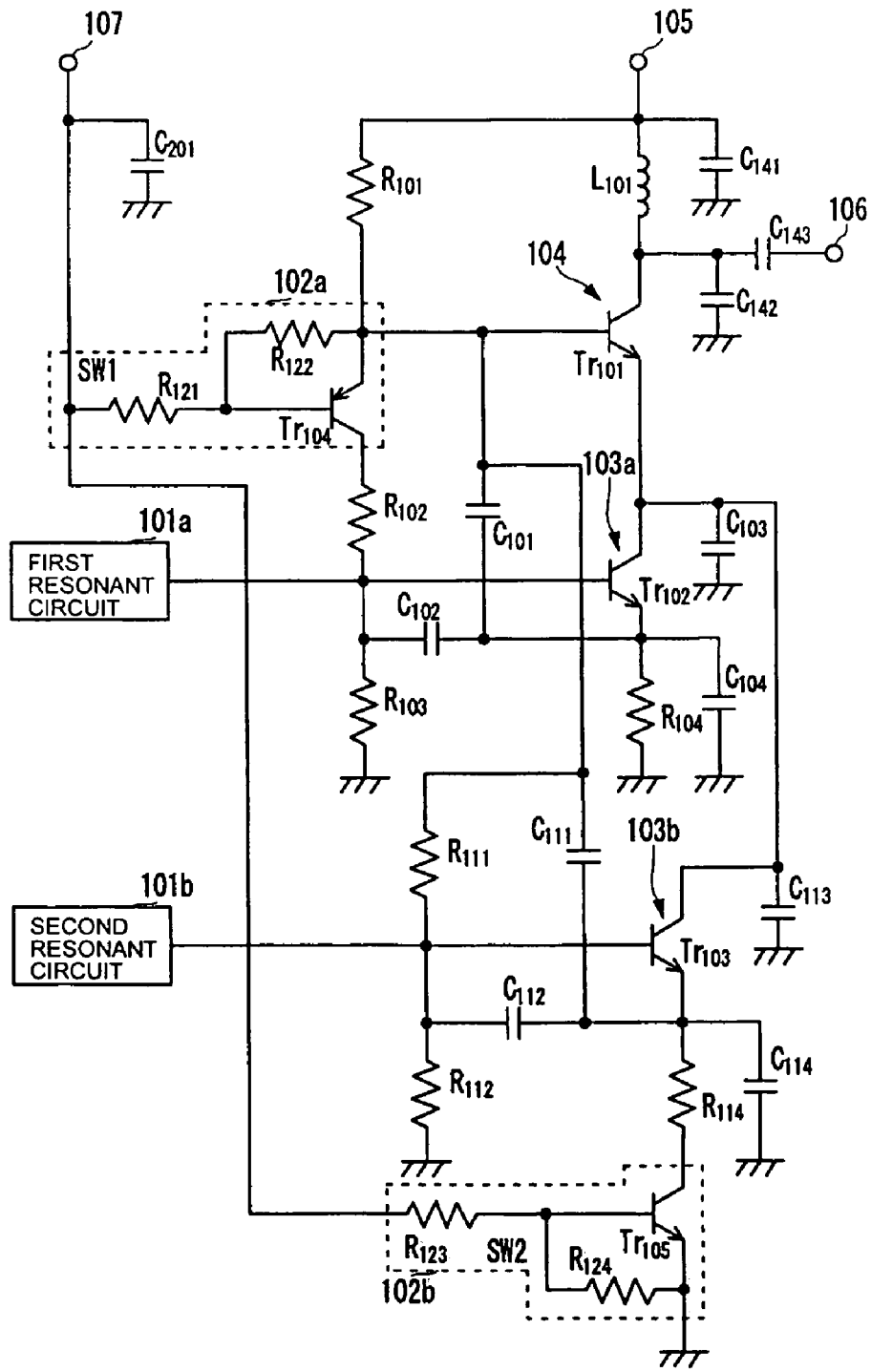
FIG. 12 is a circuit diagram of a related frequency-selective high-frequency oscillator.

FIG. 11 is a circuit diagram of a frequency-selective high-frequency oscillator according to this preferred embodiment. In FIG. 11, the same circuit components as those in the frequency-selective high-frequency oscillator shown in the fifth preferred embodiment (FIG. 5) have the same reference numerals.

In the frequency-selective high-frequency oscillator shown in FIG. 11, inductors $L_1$ and $L_2$ are connected in series, in that order, from a power terminal 5 between the collector terminal of an NPN transistor $Tr_1$ of a buffer circuit 4 and the power terminal 5, and a node between the inductors $L_1$ and $L_2$ is connected to the collector terminal of an NPN transistor $Tr_6$ of a third switching circuit (SW3) 2$c$ via a capacitor $C_{44}$. The remaining structure is preferably the same as that of the frequency-selective high-frequency oscillator shown in FIG. 5.

This structure can also achieve the same advantages as those shown in the above-described fifth preferred embodiment.

With this structure, when the switching control signal becomes "High", the NPN transistor $Tr_6$ of the third switching circuit (SW3) 2$c$ turns ON and the collector terminal of the transistor $Tr_6$ is equivalently grounded. For this reason, the node between the inductor $L_1$ and the inductor $L_2$ is grounded via the capacitor $C_{44}$, and matching between the collector terminal of the NPN transistor $Tr_1$ of the buffer circuit 4 and the output terminal 6 is achieved by the inductor $L_2$ and the capacitor $C_{43}$. In other words, when a high-frequency signal with a resonant frequency $f_2$ output from the second amplifying circuit 3$b$ is to be output from the output terminal 6, impedance matching between the collector terminal of the transistor $Tr_1$ and the output terminal 6 is achieved by means of the inductor $L_2$ and the capacitor $C_{43}$.

On the other hand, when the switching control signal becomes "Low", the NPN transistor $Tr_6$ of the third switching circuit (SW3) 2$c$ turns OFF, and therefore, the line from the emitter to the collector is equivalently open. For this reason, the node between the inductor $L_1$ and the inductor $L_2$ is not grounded, and therefore, matching between the collector terminal of the NPN transistor $Tr_1$ of the buffer circuit 4 and the output terminal 6 is achieved by the inductors $L_1$ and $L_2$ and the capacitor $C_{43}$. In other words, when a high-frequency signal with the resonant frequency $f_1$ output from the first amplifying circuit 3$a$ is to be output from the output terminal 6, impedance matching between the collector terminal of the transistor $Tr_1$ and the output terminal 6 is achieved by the inductors $L_1$ and $L_2$ and the capacitor $C_{43}$. Here, impedance matching between the output terminal of the buffer circuit 4 and the output terminal 6 can be optimized by preadjusting the inductance of the above-described inductors $L_1$ and $L_2$ for high-frequency signals with respective frequencies.

While the present invention has been described with respect to preferred embodiments, it will be apparent to those skilled in the art that the disclosed invention may be modified in numerous ways and may assume many embodiments other than those specifically set out and described above. Accordingly, it is intended by the appended claims to cover all modifications of the invention which fall within the true spirit and scope of the invention.

What is claimed is:

1. A high frequency oscillator comprising:
   a first resonant circuit and a second resonant circuit which oscillate at different resonant frequencies from each other;
   a first amplifying circuit including an NPN transistor, the first amplifying circuit being connected to the first resonant circuit;
   a second amplifying circuit including an NPN transistor, the second amplifying circuit being connected to the second resonant circuit;
   a buffer circuit arranged to amplify a signal input from one of the first amplifying circuit and the second amplifying circuit; and
   a selection circuit arranged to switch operation between the first amplifying circuit and the second amplifying circuit; wherein
   the selection circuit includes:
   a first switching circuit including a PNP transistor having a collector terminal connected to a base terminal of the NPN transistor of the first amplifying circuit and an emitter terminal connected to a power supply;
   a second switching circuit including a PNP transistor having a collector terminal connected to a base terminal of the NPN transistor of the second amplifying circuit and an emitter terminal connected to the power supply; and
   only one switching control signal input terminal for inputting a control signal; wherein
   the base terminal of the PNP transistor of the second switching circuit is connected to the switching control signal input terminal and the collector terminal of the PNP transistor of the second switching circuit is connected to the base terminal of the PNP transistor of the first switching circuit.

2. The high frequency oscillator according to claim 1, wherein a third switching circuit is disposed between the switching control signal input terminal and the second switching circuit, the third switching circuit including an NPN transistor having a collector terminal connected to the base terminal of the PNP transistor of the second switching circuit, a grounded emitter terminal, and a base terminal connected to the switching control signal input terminal.

3. The high frequency oscillator according to claim 1, wherein at least the first switching circuit includes a PNP transistor.

4. The high frequency oscillator according to claim 3, wherein the first switching circuit includes a plurality of resistors.

5. The high frequency oscillator according to claim 1, wherein at least the second switching circuit includes a PNP transistor.

6. The high frequency oscillator according to claim 5, wherein the second switching circuit includes a plurality of resistors.

7. The high frequency oscillator according to claim 1, wherein at least two of amplifying circuits are connected to the first and second resonant circuits.

8. The high frequency oscillator according to claim 7, wherein at least two of the buffer circuits are provided and arranged to amplify signals input from the at least two amplifying circuits.

9. The high frequency oscillator according to claim 1, wherein the first switching circuit includes of a PNP transistor and the second switching circuit includes a PNP transistor and a resistor connected to a base terminal of the PNP transistor thereof.

10. The high frequency oscillator according to claim 1, wherein resistors are provided for supplying a bias current and the second switching circuit is connected between the resistors such that an emitter terminal of the PNP transistor is connected to one of the resistors and a collector terminal of the PNP transistor is connected to another of the resistors.

11. The high frequency oscillator according to claim 2, wherein the first switching circuit includes a PNP transistor, the second switching circuit includes a PNP transistor and a resistor connected between a base and an emitter of the PNP transistor thereof and a resistor connected to a base terminal of the PNP transistor thereof, and the third switching circuit includes a resistor connected to a base terminal of the NPN transistor thereof.

12. The high frequency oscillator according to claim 2, wherein a pair of resistors are provided and the first switching circuit includes a PNP transistor that is disposed between the pair of resistors.

13. The high frequency oscillator according to claim 1, wherein a pair of resistors are provided and the second switching circuit includes a PNP transistor that is disposed between the pair of resistors.

14. The high frequency oscillator according to claim 1, wherein two pairs of resistors are provided, the first switching circuit includes a PNP transistor that is disposed between the first pair of resistors and the second switching circuit includes a PNP transistor that is disposed between the second pair of resistors.

15. The high frequency oscillator according to claim 1, wherein the first switching circuit includes at least one resistor, and two additional resistors are provided, and one end of the resistor of the first switching circuit is connected between the two additional resistors.

16. The high frequency oscillator according to claim 2, wherein the buffer circuit includes an NPN transistor and series connected inductors are connected between a collector terminal of the NPN transistor of the buffer circuit and a power terminal, and a node between the inductors $L_1$ and $L_2$ is connected to a collector terminal of the NPN transistor of the third switching circuit.

* * * * *